United States Patent [19]

Miller

[11] Patent Number: 5,644,536

[45] Date of Patent: Jul. 1, 1997

[54] HIGH GAIN FEEDBACK LATCH

[75] Inventor: Christopher P. Miller, Underhill, Vt.

[73] Assignee: International Business Machines Corporation, Armonk, N.Y.

[21] Appl. No.: 645,768

[22] Filed: May 14, 1996

Related U.S. Application Data

[63] Continuation of Ser. No. 487,205, Jun. 7, 1995, Pat. No. 5,541,881.

[51] Int. Cl.$^6$ ................................................ G11C 13/00
[52] U.S. Cl. .................... 365/189.05; 365/189.01; 365/230.08
[58] Field of Search ..................... 365/189.01, 189.05, 365/230.08

[56] References Cited

U.S. PATENT DOCUMENTS

| | | |
|---|---|---|
| 3,558,931 | 1/1971 | Chernoske . |
| 3,886,381 | 5/1975 | Lohmann . |
| 4,686,383 | 8/1987 | Croft . |
| 4,806,786 | 2/1989 | Valentine . |
| 4,825,100 | 4/1989 | Caspell . |
| 4,970,407 | 11/1990 | Patchen . |
| 5,220,205 | 6/1993 | Shigehara et al. . |
| 5,332,931 | 7/1994 | Crispie et al. . |
| 5,471,430 | 11/1995 | Sawada et al. . |
| 5,592,435 | 1/1997 | Mills et al. ................ 365/189.05 |

Primary Examiner—Terrell W. Fears
Attorney, Agent, or Firm—Whitham, Curtis, Whitham & McGinn; Susan M. Murray

[57] ABSTRACT

A latch circuit includes a plurality of transistors, a set input for receiving a set signal coupled to a first transistor of the plurality of transistors, a reset input for receiving a reset signal coupled to a second transistor of the plurality of transistors, a third transistor of the plurality of transistors coupled to the first transistor and a fourth transistor of the plurality of transistors coupled to the first transistor, a fifth transistor of the plurality of transistors coupled to the second transistor, a sixth transistor of the plurality of transistors coupled to the second transistor, and a node coupled to an output device, the fourth transistor and the sixth transistor. A first feedback loop includes an inverter, the output device, the node and the fourth transistor. A second feedback loop includes the inverter, the output device, the node and the sixth transistor. The first feedback loop continuously outputs a first signal and the second feedback loop continuously outputs a second signal. The first transistor enables the first feedback loop and disables the second feedback loop when the second feedback loop is outputting the second signal and the set signal changes from a first state to a second state and the second transistor enables the second feedback loop and disables the first feedback loop when the first feedback loop is outputting the first signal and the reset signal changes from the second state to the first state.

20 Claims, 4 Drawing Sheets

HIGH GAIN FEEDBACK LATCH

This is a continuation of Ser. No. 487,205, filed Jun. 7, 1995, now U.S. Pat. No. 5,541,881.

DESCRIPTION

Background of the Invention

1. Field of the Invention

The present invention generally relates to R-S (reset, set) latch circuits used in logic circuitry and integrated circuits (ICs) and more particularly to a device for latching high capacitance loads quickly and efficiently.

2. Description of the Related Art

The operation of R-S latch circuits is well-known in the art and is described in "Introduction to Switching Theory and Logical Design", Frederick J. Hill and Gerald R. Peterson, (2nd Ed., John Wiley & Sons, 1974). Generally, latch circuits detect a signal, or a change in a signal, and continue to produce an output after the signal terminates. The output is generally produced until a different signal (e.g., a change signal), or a change in a different signal, is detected by the circuit. Latch circuits are used to store outputs or delay outputs for controlling functions and timing within an integrated circuit.

Some latch circuits detect a change in a signal, such as when a signal goes from a relatively high level to a relatively low level, while other latch circuits detect a signal level and only operate when a signal reaches a predetermined (e.g., a specified) level. Generally, the latch circuits which detect a transition of a signal (e.g., transition signal detecting latch circuits) are more sophisticated than signal level latch circuits and are therefore larger and slower. However, transition signal detecting latch circuits are generally more desirable than signal level latch circuits because of their ability to discriminate changes in different signals.

A conventional latch circuit, as shown, for example, in U.S. Pat. No. 4,806,786 to Valentine, detects a transition in a signal, receives two inputs, a set signal and a reset signal. When the set signal transitions (e.g., goes from a relatively low signal to a relatively high signal), a specific circuit path is enabled which causes the latch circuit to output a high signal. The latch circuit will continue to produce the high signal even if the set signal transitions back to a low level. Once the latch circuit is producing a high output signal, the latch ignores the activity of the set signal and only monitors the reset signal.

When the reset signal transitions (e.g., goes from high to low), a different circuit path is enabled that causes the latch circuit to output a low level. As with the set signal, the latch circuit will continue to output the low signal irrespective of the activity of the reset signal. When the latch circuit is outputting a low level signal, the latch circuit only looks to the set signal and ignores the reset signal. As discussed above, upon a transition of the set signal, the latch circuit will modify its output.

Another conventional latch circuit is shown in U.S. Pat. No. 4,825,100 to Caspell which shows an R-S latch including an input stage, a double gate latch stage and an output stage. The input stage includes a pair of source coupled transistors, a pair of active loads and a biasing current source. The output of the input stage is coupled to the latch stage and the output stage. The latch stage includes a pair of source coupled double gate transistors and provides the latching mechanism which prevents the outputs from changing until an appropriate set or reset pulse is received.

In Caspell one pair of the gates in the latch stage are coupled to an inverted set and reset input. This pair of additional gates enables the Q and Q output to switch symmetrically, thus preventing delay between the Q and Q output.

Conventional complementary metal oxide semiconductor (CMOS) static latch circuits comprise either cross-coupled gates or cross-coupled inverters. Such circuits have asymmetric delay and/or transition times. When such circuits are used to drive large loads (e.g., such as 10–100 gates or larger), these inherent problems become worse, especially where high performance/minimum delay is important. Additional states of buffering reduce problems with asymmetry but at the cost of increased circuit delay.

The main objective of the invention is to produce high performance with large capacitive loads. Conversely, the main objective of Valentine is the produce a latch that has a small size and a small device count. The main objective of the Caspell latch is symmetric output transitions. For conventional latch circuits to drive large loads they rely upon additional stages and the circuits therefore have more devices which makes them slower.

SUMMARY OF THE INVENTION

In view of the foregoing problems of the conventional systems, it is an object of the present invention to provide a structure for a transition-type latch circuit that permits high performance operation and provides symmetrical switching/delay characteristics and scalability to drive large loads.

Another object of the present invention is to provide a structure for a transition-type latch circuit that responds in less time to an input as compared to the conventional latch circuits.

In performing the above and other objects of the present invention, a structure according to the present invention is provided that includes a latch circuit comprising a plurality of transistors, a set input for receiving a set signal coupled to a first transistor of the plurality of transistors, a reset input for receiving a reset signal coupled to a second transistor of the plurality of transistors, a third transistor of the plurality of transistors coupled to the first transistor and a fourth transistor of the plurality of transistors coupled to the first transistor, a fifth transistor of the plurality of transistors coupled to the second transistor, a sixth transistor of the plurality of transistors coupled to the second transistor, a node coupled to output means, the fourth transistor and the sixth transistor, a first feedback loop comprising inverter means, the output means, the node and the fourth transistor; and a second feedback loop comprising the inverter means, the output means, the node and the sixth transistor. The first feedback loop continuously outputs a first signal and the second feedback loop continuously outputs a second signal. The first transistor enables the first feedback loop and disables the second feedback loop when the second feedback loop is outputting the second signal and the set signal changes from a first state to a second state. The second transistor enables the second feedback loop and disables the first feedback loop when the first feedback loop is outputting the first signal and the reset signal changes from the second state to the first state.

With the structure of the invention, a transition-type latch circuit is provided which permits a high-performance operation and which provides symmetrical switching/delay characteristics and scalability to drive large loads. Further, the transition-type latch circuit according to the present invention responds in significantly less time to an input as compared to conventional latch circuits. Thus, the present invention provides a fast, high-capacitance load, small-layout-area latch.

Other advantages of the present invention include the separation of devices responsible for switching the output state from devices used to maintain the output state. Separating these devices allows the use of large devices which turn on only temporarily to switch output to a specific state. The large devices then shut off and therefore do not impede switching of output to the opposite state. Devices used to maintain the output state are not sized for driving capability and therefore do not impede switching of the output very much. This is especially true when switching large capacitive loads with 100 gates or more.

Another advantage of the invention is the merging of input combinatorial logic with set/reset latch logic.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
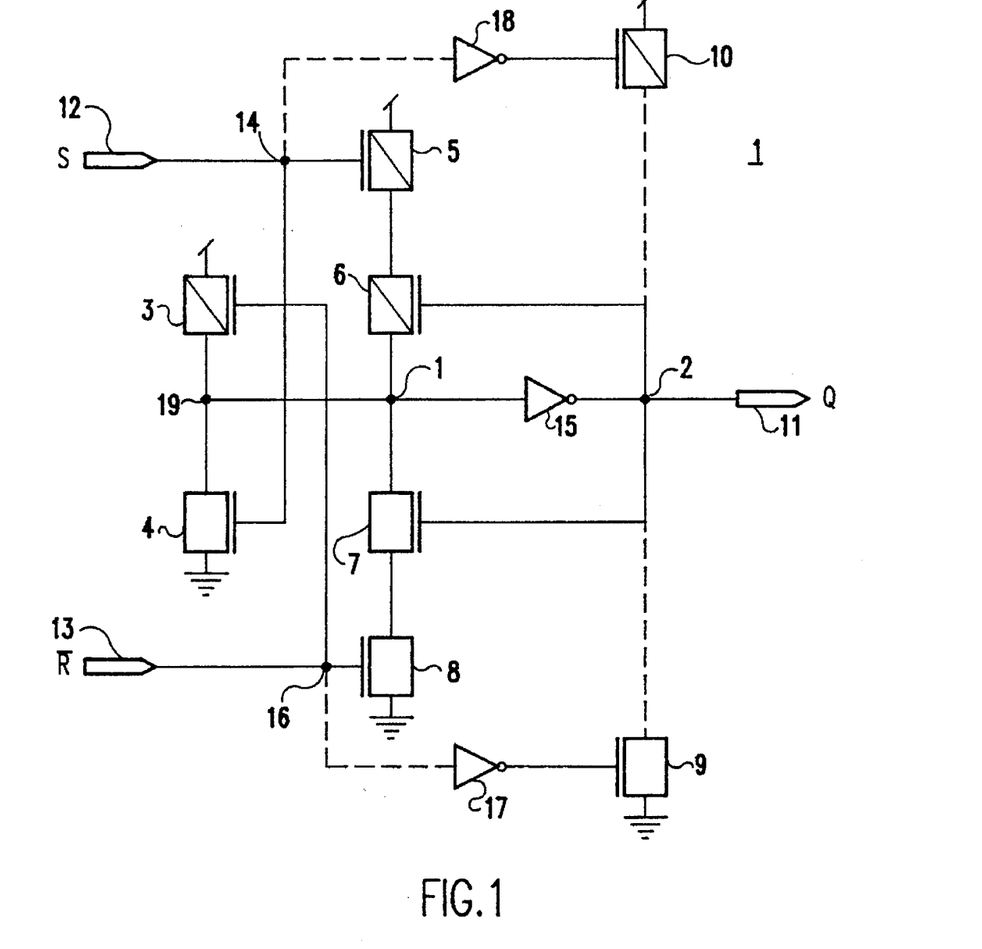
FIG. 1 is a schematic drawing of a latch circuit according to the present invention which includes means for dynamically switching of driving transistors and switched feedback to permit high performance operation, symmetrical switching/delay characteristics and scalability to drive large loads.

Referring now to the drawings, and more particularly to FIG. 1, a preferred embodiment of the present invention is illustrated in which dynamic switching of driving transistors and switch feedback is performed, thereby resulting in a high-performance operation providing symmetrical switching/delay characteristics and scalability.

The latch circuit 1 according to the present invention includes a set input 12 for issuing a set signal S and a reset input 13 for issuing a reset signal R.

Set input 12 is connected to a gate of transistor 4 and a gate of transistor 5 via a node 14. Reset input 13 is connected to a gate of transistor 8 and a gate of transistor 3 via node 16.

Transistor 3 has a source connected to a voltage source, a gate connected to reset input 13 via node 16 and a drain connected to an inverter 15 via nodes 19 and 1. Node 1 and node 19 are equivalent and will hereinafter be referred to as node 1.

Transistor 4 has a source connected to ground, a gate connected to set input 12 via node 14 and a drain connected to inverter 15 via node 1.

Transistor 5 has a source connected to a voltage source, a gate connected to set input 12 and a drain connected to a source of transistor 6. Transistor 8 has a source connected to ground, a gate connected to reset input 13 and a drain connected to a source of transistor 7.

Inverter 15 can maintain the output signal Q for a noise margin, while inverter 17 and inverter 18 provide switching power. Additionally, the drive paths are easily scaled and optimized for high performance and symmetrical response. Alternatively, inverter 15 can be sized to hold the output signal and provide the switching power.

The input of inverter 18 (preferably a ratioed inverter) is connected to node 14 and the output of inverter 18 is connected to the gate of transistor 10. The input of inverter 17 (preferably an oppositely ratioed inverter) is connected to node 16 and the output if inverter 17 is connected to the gate of transistor 9. These paths have ratioed logic with no feedback and are therefore fast paths.

Transistor 6 has a source connected to a drain of transistor 5, a gate connected to output 11 via node 2 and a drain connected to an input of inverter 15 via node 1.

Transistor 7 has a source connected to a drain of transistor 8, a gate connected to output 11 via the node 2 and a drain connected to an input of the inverter 15 via node 1.

Transistors 3, 5, 6 and 10 are preferably p-type transistors, while transistors 4, 7, 8 and 9 are preferably n-type transistors. The advantages of using p-type and n-type transistor is that they are complimentary. Thus, a high level applied to the gate of an n-type turns it on while the same level applied to the gate of a p-type turns it off. The converse is also true.

In operation, a set signal S, which varies between a high signal state and a low signal state, is input to set input 12. When the set signal S is active it transitions from low signal to a high signal level, node 14 is brought to the same high level. The high signal of node 14 connected to inverter 18 causes inverter 18 to output a low level signal. The low level signal is then applied to the gate of transistor 10 which turns transistor 10 on. The drain of transistor 10 produces a high level signal and output 11 therefore produces a high level signal. Since this drive path has ratioed logic and does not involve feedback it is a fast path.

For the latch circuit to be "set" reset signal R would be at a high state and set signal S would have gone from a low signal to a high signal, as discussed in the Background section. When set signal S is active a high signal exists at node 14 which turns transistor 5 off and therefore transistor 5 does not produce any signal at its drain to the source of transistor 6 and disables transistor 6. Similarly, reset signal R is at a high state and node 16 is also at a high state. The gate of transistor 8 is connected to node 16 and the high signal turns transistor 8 on which enables transistor 7.

A set feedback loop includes transistor 7, transistor 8, node 1, node 2 and inverter 15. Once a high signal is established at node 2 by transistor 10, as described above, that high signal is maintained by the set feedback loop. Since reset signal R is at a high state, transistor 8 is on and transistor 7 is enabled. Transistor 7 has its gate connected to node 2 and the high signal turns transistor 7 on so that transistor 7 produces a low signal at its drain. This low signal at transistor 8 also exists at node 1 and the input of inverter 15. As described above, inverter 15 converts the signal to a high signal at node 2 and therefore output 11 maintains a high output. Once again, the high signal at node 2 turns transistor 7 on and the "loop" continues so that a high signal is maintained at output 11.

As described in the background section, one of the merits of a latch circuit is to maintain a "set" condition even if the set signal is discontinued. The set feedback loop described above continues to operate even if the set signal S does not maintain a high level. If set signal S goes from a high level to a low level and reset signal R remains at a high level the latch circuit will still be in a set condition and will continue to produce the high signal at output 11.

The latch circuit in the set condition continues to produce the high signal because the set loop is insulated from the variations of set signal S once the set loop is activated. A drop in the set signal S will produce a low signal at node 14. The low signal will be input to the gate of transistor 5 and turn transistor 5 on and enable transistor 6; however, transistor 6 will not interfere with the set loop and node 1 will remain at a low level signal because transistor 6 will continue to receive a high signal at its gate that is connected to node 2. A high signal at the gate of transistor 6 will keep transistor 6 off because it is a p-type transistor, as discussed above.

Also, a low signal at node 14 will produce a high signal output from inverter 18 and turn transistor 10 off. Therefore a drop in the set signal "S" will not allow transistor 10 to affect the set feedback loop.

A transition of the reset signal R (from a high signal to a low signal) will disable the set feedback loop and change the signal at output 11 from a high state to a low state. When the reset signal R is active it transitions from high signal to a low signal level, node 16 is brought to the same low level. The low signal of node 16 connected to inverter 17 causes inverter 17 to output a high level signal. The high level signal is then applied to the gate of transistor 9 which turns transistor 9 on. The drain of transistor 9 produces a low level signal and output 11 therefore produces a low level signal. Since this drive path has ratioed logic and does not involve feedback it is a fast path.

For the latch circuit to be "reset" set signal S would be at a low state and reset signal R would have gone from a high signal to a low signal, as discussed in the Background section. When reset signal R is active a low signal exists at node 16 which turns transistor 8 off and therefore transistor 8 does not produce any signal at its drain to the source of transistor 7 and disables transistor 7. Similarly, set signal S is at a low state and node 14 is also at a low state. The gate of transistor 5 is connected to node 14 and the low signal turns transistor 5 on which enables transistor 6.

A reset feedback loop includes transistor 6, transistor 5, node 1, node 2 and inverter 15. Once a low signal is established at node 2 by transistor 9, as described above, that low signal is maintained by the reset feedback loop. Since set signal S is at a low state, transistor 5 is on and transistor 6 is enabled. Transistor 6 has its gate connected to node 2 and the low signal turns transistor 6 on so that transistor 6 produces a high signal at its drain. This high signal at transistor 6's drain also exists at node 1 and the input of inverter 15. As described above, inverter 15 converts the signal to a low signal at node 2 and therefore output 11 maintains a low output. Once again, the low signal at node 2 turns transistor 6 on and the "loop" continues so that a low signal is maintained at output 11.

As described in the background section, one of the merits of a latch circuit is to maintain a "reset" condition even if the reset signal is discontinued. The reset feedback loop described above continues to operate even if the reset signal R does not maintain a low level. If reset signal R goes from a low level to a high level and set signal S remains at a low level the latch circuit will still be in a reset condition and will continue to produce the low signal at output 11.

The latch circuit in the reset condition continues to produce the low signal because the reset loop is insulated from the variations of reset signal R once the set loop is activated. A rise in the reset signal R will produce a high signal at node 16. The high signal will be input to the gate of transistor 8 and turn transistor 8 on and enable transistor 7; however, transistor 7 will not interfere with the set loop and node 1 will remain at a high level signal because transistor 7 will continue to receive a low signal at its gate that is connected to node 2. A low signal at the gate of transistor 7 will keep transistor 7 off because it is a p-type transistor, as discussed above.

Also, a high signal at node 16 will produce a low signal output from inverter 17 and turn transistor 9 off. Therefore an increase in the reset signal R will not allow transistor 9 to affect the set feedback loop.

In addition transistor 3 and transistor 4 provide quick switching of the signal state of node 1 when a transition from a set to reset or reset to set is performed by the latch circuit. Specifically, when the latch is transitioning from set to reset, set signal S will be low and reset signal R will be transitioning from high to low. Upon reset signal R's transition, node 16 has a low signal. Node 16 transmits the low signal to the gate of transistor 3 and turns transistor 3 on. Transistor 3 then outputs a high signal to node 1, which is inverted by inverter 15 and output by output 11 as a low signal. Transistor 4 does not interfere with this process because set signal S is low and node 14, that is connected to the gate of transistor 4, is low and therefore transistor 4 is off. The low level at node 16 turns transistor 8 off and breaks the set feedback loop.

Similarly, the same quick switching occurs when the latch circuit transitions from reset to set states. When the latch circuit is transitioning from reset to set, reset signal R will be high and set signal S will be transitioning from low to high. Upon set signal S's transition, node 14 has a high signal. Node 14 transmits the low signal to the gate of transistor 4 and turns transistor 4 on. Transistor 4 then outputs a low signal to node 1, which is inverted by inverter 15 and output by output 11 as a high signal. The high level at node 14 turns transistor 5 off and breaks the set feedback loop.

Since there are no cross-over currents this arrangement is faster that an inverter or a gate arrangement and provides superior performance over the conventional latch circuits. Additionally, since inverter 17 and inverter 18 are ratioed they switch faster than inverter 15. Inverter 17 is biased to invert a low signal more quickly than a high signal and therefore allows the high signal to turn on transistor 9 and transmit a low signal to node 2 more quickly than if inverter 15 were performing both functions of driving and feedback. Similarly inverter 18 is biased to invert a low signal quicker than inverter 15 and allows node 2 to exhibit a high signal faster than inverter 15 could. Thus the design allows higher gain and the ability to drive large loads.

Figure 2:
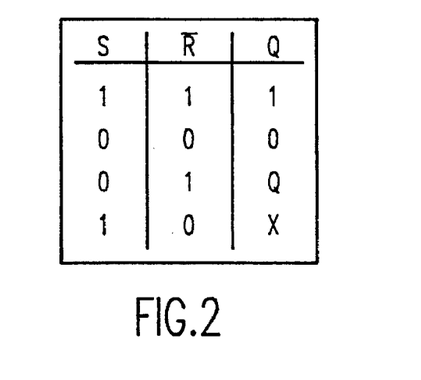
FIG. 2 is a truth table showing the outputs that result from various inputs to the latch circuit according to the present invention and illustrated in FIG. 1.

FIG. 2 shows a truth table of inputs and outputs for the above latch circuit. In the columns labeled S and R, which represent input set (S) and reset (R) signals, "1" represents a transition from a low signal state to a high signal state and "0" represents a transition from a high signal state to a low signal state. In the column labeled Q, the output of the latch circuit, "1" represents a high signal state, "0" represents a low signal state, the letter Q represents a continuation of the previous output and the letter X represents undetermined output.

In operation, the truth table shows that when signal S and signal R transition from a low signal state to a high signal state, the latch circuit outputs a high signal state. When signal S and signal R transition from a high signal state to a low signal state, the latch circuit outputs a low signal state.

When signal S transitions from a high signal state to a low signal state and signal R transitions from a low signal state to a high signal state, the output of the latch circuit remains the same as its previous output. If the latch circuit was outputting a high signal state, the latch would continue to output a high signal state. If the latch circuit was outputting a low signal state it would continue to output a low signal state.

In other words, signal S transitioning from a high signal state to a low signal state will not change the latch circuit's output. Similarly, signal R transitioning from a low signal state to a high signal state will not change the latch circuit's output.

When signal S transitions from a low signal state to a high signal state and signal R transitions from a high signal state to a low signal state, the latch circuit will not output a dependable signal and therefore produces indeterminate output. This occurs because both the set and reset feedback loops are disengaged and because the signals conflict.

Figure 3:
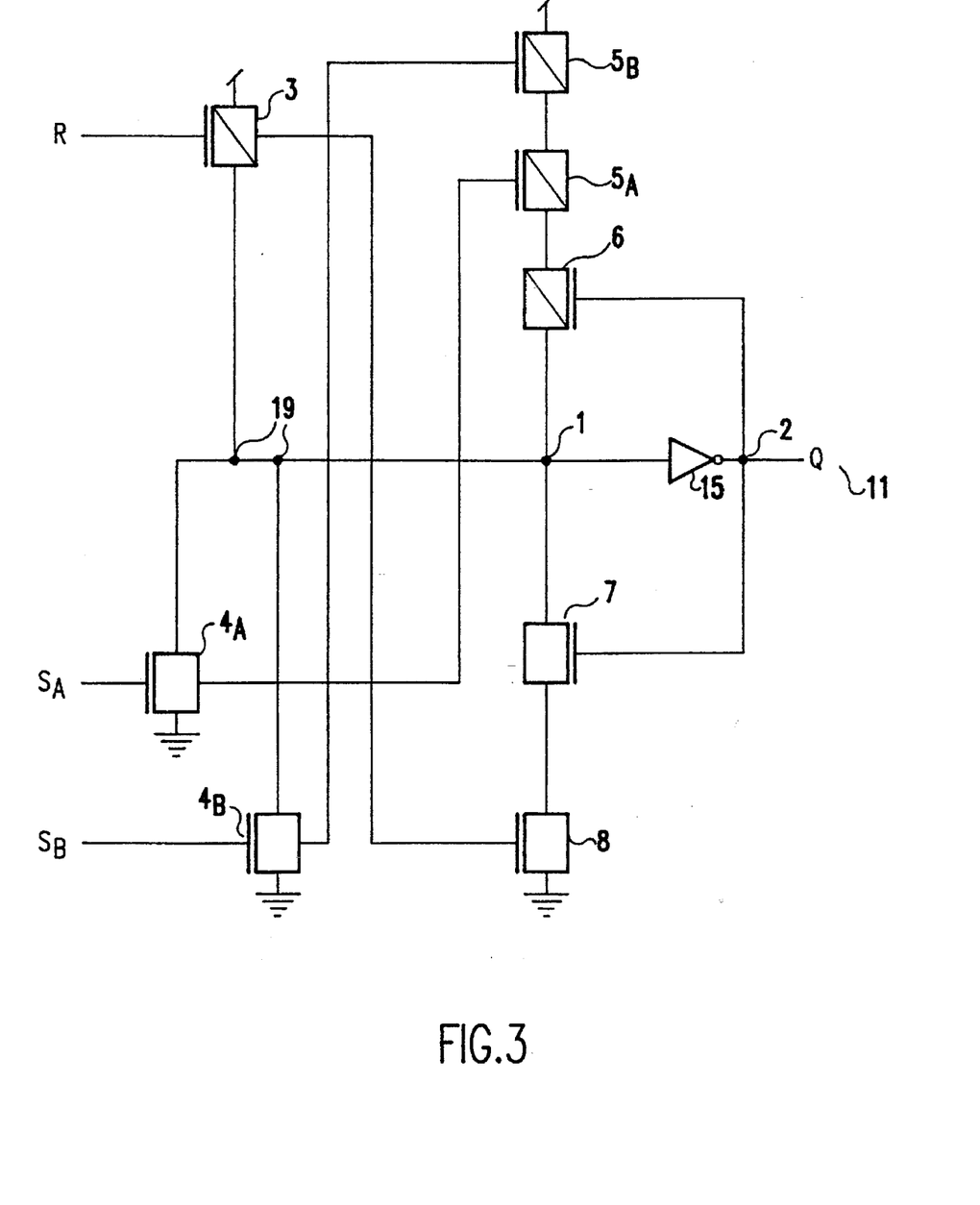
FIG. 3 is a schematic drawing of a latch circuit according to the present invention which is similar to FIG. 1, but includes NOR set inputs $S_A$ and $S_B$.

FIG. 3 represents an embodiment similar to FIG. 1 but with NOR set inputs. The numbering of elements shown in FIG. 3 correspond to the elements shown in FIG. 1 and the description of the same will not be repeated for sake of brevity.

New elements include $S_A$ and $S_B$ which represent two different set signals. The circuit is thus modified to have transistor $4_A$ and $4_B$ and $5_A$ and $5_B$ that perform the NOR operation.

Set signal $S_A$ is input to the gate of transistor $4_A$. Transistor $4_A$ has a source connected to ground and a drain connected to node 1. Set signal $S_A$ is also input to the gate of transistor $5_A$. Transistor $5_A$ had a source connected to a voltage source and a drain connected to a source of transistor $5_B$.

Similarly set signal $S_B$ is input to the gate of transistor $4_B$. Transistor $4_B$ has a source connected to ground and a drain connected to node 1. Set signal $S_B$ is also input to a gate of transistor $5_B$. Transistor $5_B$ has a drain connected to transistor 6. The transistors have similar characteristics as the similarly number transistors of FIG. 1.

Transistor $4_A$ and transistor $4_B$ perform identical functions as that of transistor 4 shown in the first embodiment except they are connected to separate set signals. Transistor $5_A$ and transistor $5_B$ perform identical functions as that of transistor 5 shown in the first embodiment except they are also connected to separate set signals.

A "set" operation with respect to set signal $S_A$, that equally applies to set signal $S_B$, will be described. Assuming that the latch circuit is reset, it will be outputting a low signal from output 11 and reset feedback loop, including transistor $5_A$, transistor $5_B$, transistor 7, node 1, node 2 and inverter 15 will be maintaining the low signal output. Reset signal R will be in a high state and set signal $S_A$ will transition from low to high.

Transistor $4_A$, which is an n-type transistor, is turned on by the high set signal $S_A$ and outputs a low signal to node 1. The low signal at node 1 is inverted by inverter 15 and output as a high signal at node 2 and output 11. Transistor $5_A$ is turned off by the high set signal $S_A$ and the reset feedback loop operation is terminated. High reset signal R turns on transistor 8 which, as described in detail above, enables transistor 7 and the set feedback loop is made operational and maintains a high output at output 11.

The set signal $S_B$ performs the identical operation with its associated transistors as that described with respect to set signal $S_A$. The latch is reset by a low reset signal R in the manner described with respect to the first embodiment.

The latch circuit shown in FIG. 3 will perform a "set" of the latch and output a high signal whenever set signal $S_A$ or set signal $S_B$ transitions to a high level and reset signal is at a high level. Similarly both set signal $S_A$ and set signal $S_B$ must be at a low level signal state for the latch circuit to perform a "reset." Transistor $5_A$ and transistor $5_B$, both p-type transistors, must both be on (i.e. receiving a low level set signal) before transistor 6 can be enabled. If transistor $5_A$ is not on the signal will not be transferred to transistor 6, regardless of the condition of transistor $5_B$. Similarly, if transistor $5_B$ is not on, transistor $5_A$ will not be enabled and cannot transfer the signal to transistor 6. Therefore, the latch circuit shown in FIG. 3 performs a logical "NOR" operation with respect to the two set signals.

In addition, driver circuits, similar to those shown in FIG. 1 (one that includes inverter 17 and transistor 9 and the one that includes inverter 18 and transistor 10) can be included in the latch circuit shown in FIG. 3; however, each additional set or reset input requires an additional separate driver circuit and for some specific applications the driver circuits may not produce increased performance. They are not shown on FIG. 3, or FIGS. 4 and 5, discussed below, for sake of clarity.

Thus, the "set" operation, as discussed above, can be enabled by either signal $S_A$ or $S_B$ performing a specific condition such as going from a low state to a high state. If either signal $S_A$ or $S_B$ performs a specific condition the Q will output a high output, the set feedback loop will be made operational and the reset loop terminated.

While the logical "NOR" operation has been shown with respect to the set signals, it is equally applicable to the reset signal or both the set and reset signal as is known by an artisan ordinarily skilled in the art.

The circuit provides superior performance when compared to conventional latch circuits because of the use of dynamic transistors 3, $4_A$ and $4_B$ to set and reset node 1 instead of the cross-coupled gates or cross-coupled inverters. Additionally, use of the separate logic paths instead of a OR gate reduces circuit delay. The latch circuit of FIG. 3 provides increased speed and symmetrical switching/delay characteristics when compared to conventional NOR latch circuits.

Figure 4:
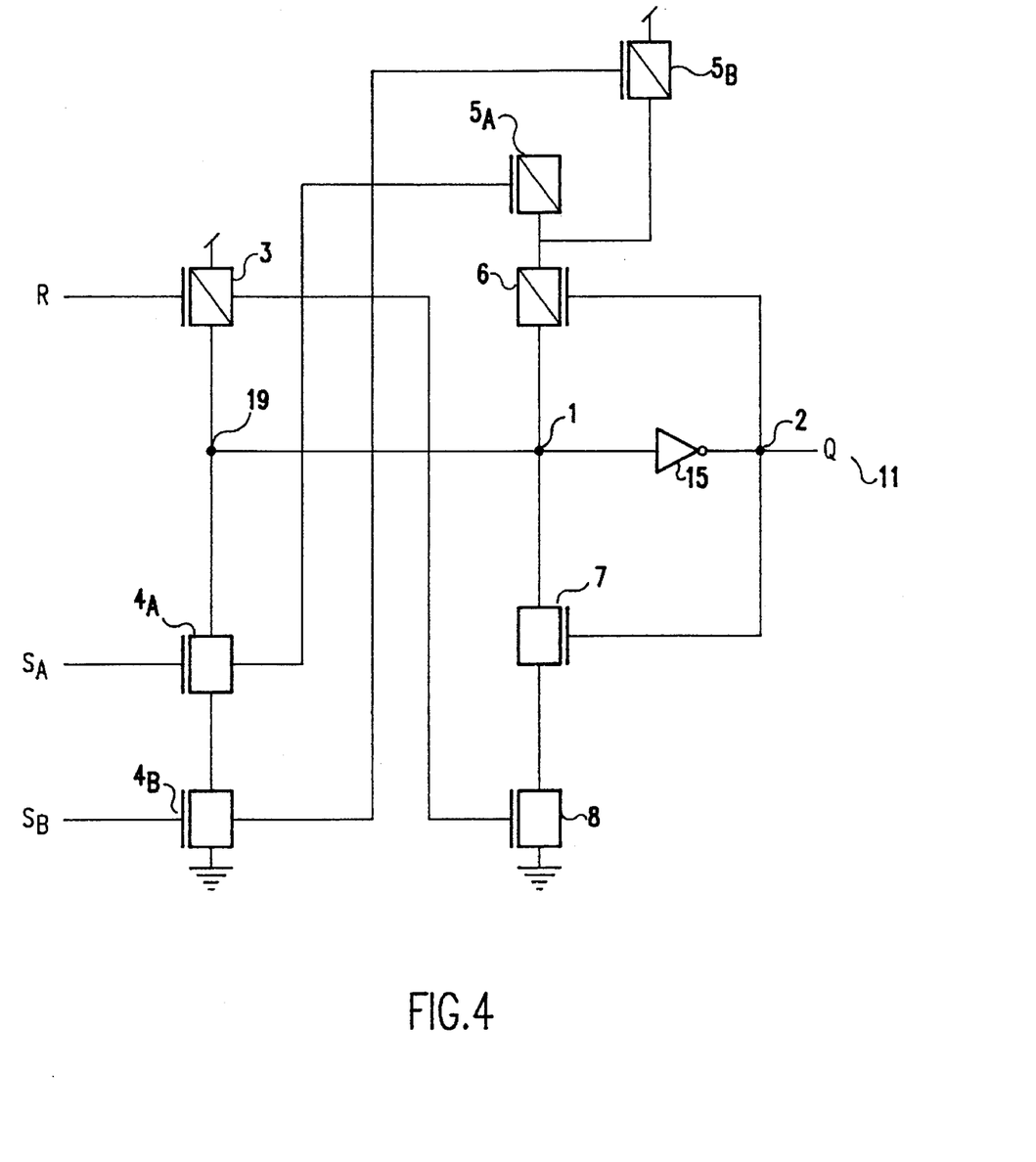
FIG. 4 is a schematic drawing of a latch circuit according to the present invention which is similar to FIG. 1, but includes NAND set inputs $S_A$ and $S_B$.

FIG. 4 represents an embodiment similar to FIG. 1 with NAND set inputs. The numbering of the elements in FIG. 4 correspond to the elements shown in FIG. 1 and the description of the same will not be repeated for sake of brevity.

As with FIG. 3, new elements include $S_A$ and $S_B$ which represent two different set signals. The circuit is thus modified to have transistor $4_A$ and $4_B$ and $5_A$ and $5_B$ that perform the NAND operation.

As demonstrated with respect to FIG. 3, transistors $4_A$ and $4_B$ preform the same function as transistor 4 in FIG. 1; however, FIG. 4 demonstrates a logical "NAND" function. Therefore, transistors $4_A$ and $4_B$ are in series and the latch circuit requires both set signal $S_A$ and set signal $S_B$ to have a high signal to be set.

The detailed transmission of the signals through the latch circuit is substantially similar to that described with respect to FIG. 3 and will not be repeated here for sake of brevity, except for the differences. Assuming, again, that the latch circuit is in a reset state the reset loop would be operational, output 11 would be outputting a low signal and reset signal R would be at a high state. Both set signal $S_A$ and set signal $S_B$ must exhibit a high signal so that both transistor $4_A$ and transistor $4_B$ are turned on. When both transistor $4_A$ and transistor $4_B$ are turned on, a low signal will be output from the drain of transistor $4_A$ to node 19. As described above, the sequence of switching will proceed so that the set loop is enabled and output 11 outputs a high signal.

If transistor $4_A$ is not turned on by a high set signal $S_A$ the low signal cannot be transmitted from the drain of transistor $4_B$ to node 19, regardless of the state of transistor $4_B$. Similarly if transistor $4_B$ is not turned on by a high set signal $S_B$ transistor $4_A$ will not be enabled and cannot transmit a signal to node 19. Therefore, both transistor $4_A$ and transistor $4_B$ must be turned on by both set signal $S_A$ and set signal $S_B$ for the latch circuit to be set.

As also shown with respect to FIG. 3, transistor 5 of FIG. 1, is replaced with transistor $5_A$ and transistor $5_B$; however, unlike FIG. 3 the two transistor are not in series. Either set signal, set signal $S_A$ or set signal $S_B$, can transmit a low signal to the gate of transistor 6 to turn transistor 6 on. This is necessary so that the reset loop can be enabled, as described above, whenever either set signal $S_A$ or set signal $S_B$ is not active and producing a high signal. Thus, the circuit will maintain a reset condition unless both set signals exhibit a high, active signal and the latch circuit performs a NAND function without the need for a separate NAND circuit or device.

Thus, the "set" operation, as discussed above, can be enabled by signal $S_A$ and $S_B$ performing a specific condition such as both going from a low state to a high state. If both signals $S_A$ and $S_B$ performs a specific condition the Q will output a high output, the set feedback loop will be made operational and the reset loop terminated. The advantages of the circuit shown in FIG. 4 are similar to those discussed with respect to FIG. 3. The circuit has greater speed, higher performance and provides symmetrical switching/delay characteristics. Also, the NAND operation can be performed with respect to the reset signal and driving circuits can be added where appropriate, as discussed above.

Figure 5:
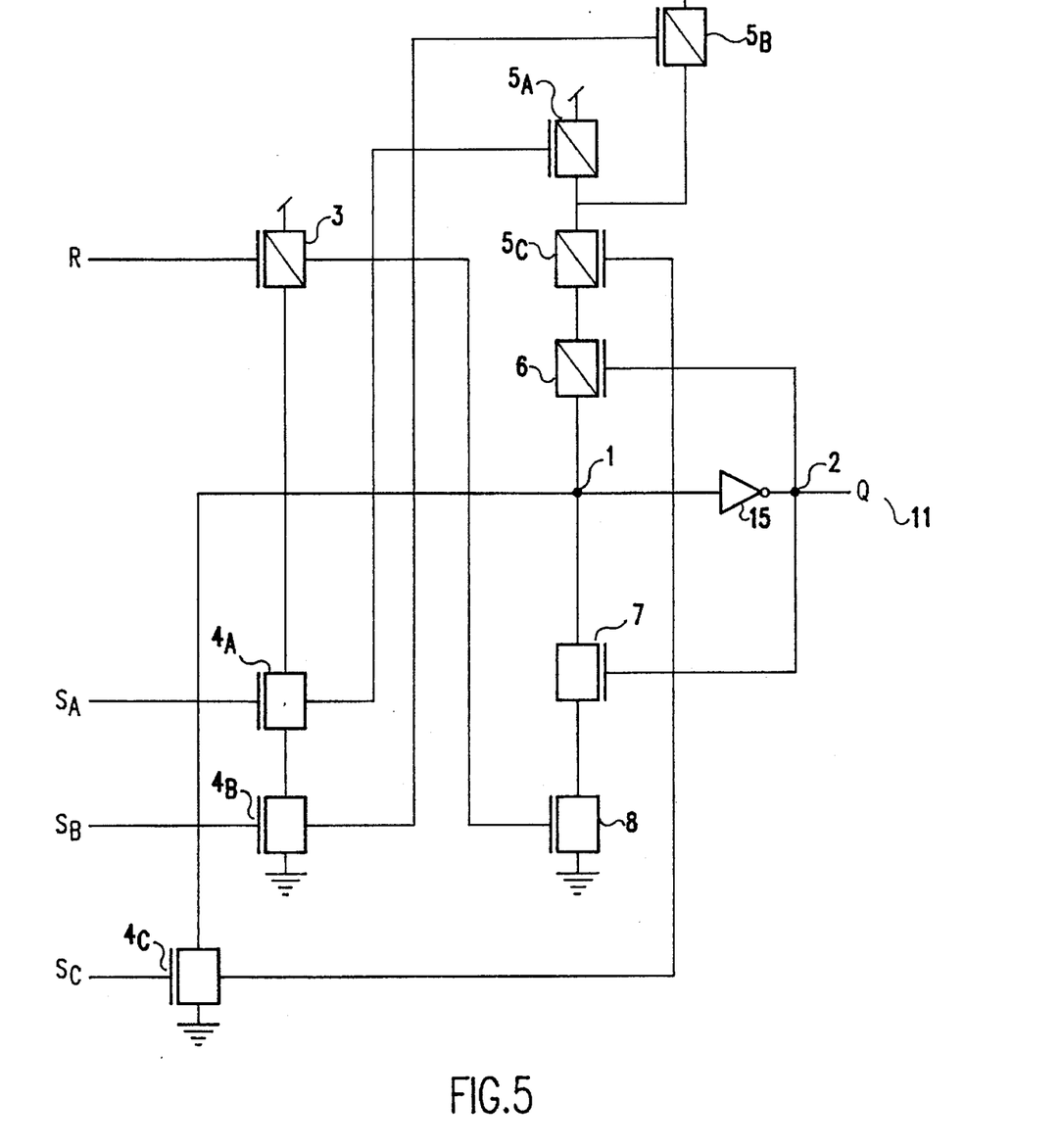
FIG. 5 is a schematic drawing of a latch circuit according to the present invention which is similar to FIG. 1, but includes NOR/NAND inputs $S_A$ $S_B$ and $S_C$.

FIG. 5 represents an embodiment similar to FIG. 1 with NOR and NAND set inputs. The numbering of the elements shown in FIG. 5 correspond to the elements shown in FIG. 1 and the description of the same will not be repeated for sake of brevity.

New elements include $S_A$, $S_B$ and $S_C$ which represent three different set signals. The circuit is thus modified to have transistor $4_A$, $4_B$, and $4_C$ and $5_A$, $5_B$ and $5_C$ which have the same characteristics as discussed with respect to FIGS. 3 and 4.

FIG. 5 represents a "NAND/NOR" arrangement where the latch circuit can be set by one of two conditions. First it can be set by set signal $S_C$ having a high level signal or secondly it can be set by both set signal $S_A$ and set signal $S_B$ having a high level signal. The operation of the logical NOR operation between set signal $S_C$ and set signals A and B ($S_A$ and $S_B$) is preformed as shown between set signal $S_A$ and set signal $S_B$ in FIG. 3 and will not be repeated here for sake of brevity. The operation of the logical AND operation between set signal $S_A$ and set signal $S_B$ is as shown between set signal $S_A$ and set signal $S_B$ in FIG. 4 and will not be repeated here for sake of brevity.

As with FIGS. 3 and 4, the circuit shown in FIG. 5 has greater speed, higher performance and provides symmetrical switching/delay characteristics. Also, the NAND/NOR operation can be performed with respect to the reset signal and driving circuits can be added where appropriate, as discussed above.

The above embodiments of the invention utilize dynamic operation of transistors 3 and 4 to set and reset node 1. Activation of either the set input 12 or the reset input 13 will change node 1 from a high signal state to a low signal state or from a low signal state to a high signal state.

Since transistor 3 and transistor 4 have no cross-over component, this stage is quicker than an inverter or a gate.

While node 1 is switching, the feedback devices made up of transistor 5/transistor 6 and transistor 7/transistor 8, which are normally used to hold the signal state of node 1 after the input signal has terminated, are connected such that feedback is disabled.

Consequently, the delay effects of the feedback path are nearly eliminated. After the output 11 takes the next signal state, the feedback path is re-enabled to maintain the state of the latch. Because of the switched operation of the feedback, delay effects are minimized while latch stability for noise margin is increased.

The inventive circuit uses a complementary reset input and non-crossover drive to obtain minimum circuit delay with symmetrical output transitions. Further, the circuit uses switched feedback to further improve circuit speed while improving circuit noise margin.

The advantages of this latch circuit are that circuit delay is minimized, circuit response is symmetrical and that the circuit is exceptionally suited to drive large capacitive loads.

While the invention has been described with respect to high and low signals, the latch circuit can be utilized with any type of signals that transition from one state to another, as discussed in the Background section.

While the invention has been described in terms of a preferred embodiment, those skilled in the art will recognize that the invention can be practiced with modification within the spirit and scope of the appended claims.

Having thus described my invention, what I claim as new and desire to secure by Letters Patent is as follows:

1. An integrated circuit comprising:

first input means for receiving a first signal;

means for evaluating coupled to said first input means;

second input means for receiving a second signal, coupled to said means for evaluating; and means for outputting one of a third signal and a fourth signal coupled to said means for evaluating, wherein said means for evaluating controls said means for outputting, based on said first signal and said second signal, so that one of said third signal and said fourth signal is output, wherein said means for outputting maintains outputting of one of said third signal and said fourth signal, wherein said third signal is output by said means for outputting until said second signal is received by said second input means and said fourth signal is output by said means for outputting until said first signal is received by said first input means, and wherein said means for evaluating includes a first transistor for processing said first signal and a second transistor for processing said second signal.

2. An integrated circuit as in claim 1, wherein said first transistor comprises a P-channel transistor and said second transistor comprises an N-channel transistor.

3. An integrated circuit as in claim 1, wherein said means for evaluating includes a feedback loop, wherein said feedback loop includes a third transistor coupled to an inverter and a fourth transistor coupled to said inverter.

4. An integrated circuit as in claim 3, wherein said third transistor comprises a P-channel transistor and said fourth transistor comprises an N-channel transistor.

5. An integrated circuit as in claim 4, wherein said third transistor is controlled by said first transistor and said fourth transistor is controlled by said second transistor.

6. An integrated circuit as in claim 5, wherein said third transistor has a gate connected to said output, a source connected to said first transistor and a drain connected to said inverter and said fourth transistor has a gate connected to said output, a source connected to said second transistor and a drain connected to said inverter.

7. An integrated circuit as in claim 3, wherein said means for evaluating includes:

a fifth transistor having a gate connected to said second input, a source connected to a first voltage and a drain connected to said inverter; and a sixth transistor having a gate connected to said first input, a source connected to a second voltage and a drain connected to said inverter, wherein said fifth transistor comprises a P-channel transistor and said sixth transistor comprises an N-channel transistor.

8. An integrated circuit as in claim 2, wherein said means for evaluating includes:

a first inverter/transistor pair having a second inverter and a seventh transistor; and a second inverter/transistor pair having a third inverter and an eighth transistor, wherein said seventh transistor has a gate connected to said second inverter, a source connected to a first voltage and a drain connected to said output, and said eighth transistor has a gate connected to said third inverter, a source connected to a second voltage and a drain connected to said output.

9. An integrated circuit as in claim 8, wherein said second inverter and said third inverter provide switching power to said seventh transistor and said eighth transistor.

10. An integrated circuit as in claim 8, wherein said second inverter has a first bias and said third inverter has a second bias opposite said first bias.

11. A latch circuit comprising:

a first feedback loop coupled to a first input and an output;

a second feedback loop coupled to a second input and said output;

a first transistor, coupled to said first input, for activating said first feedback loop; and a second transistor, coupled to said second input, for activating said second feedback loop.

12. A latch circuit as in claim 11, wherein said first feedback loop comprises a third transistor and an inverter coupled to said output and said second feedback loop comprises a fourth transistor coupled to said output and said inverter.

13. A latch circuit as in claim 11, further comprising a fifth transistor coupled to said second input and a sixth transistor coupled to said first input, wherein said fifth transistor and said sixth transistor are each additionally coupled to one of said first feedback loop and said second feedback loop.

14. A latch circuit as in claim 11, further comprising a first inverter/transistor pair having a second inverter and a seventh transistor and a second inverter/transistor pair having a third inverter and an eighth transistor.

15. An integrated circuit as in claim 14, wherein said second inverter and said third inverter provide switching power to said seventh transistor and said eighth transistor.

16. A latch circuit as in claim 14, wherein said second inverter has a first bias and said third inverter has a second bias opposite said first bias.

17. A latch circuit as in claim 11, further comprising an additional first transistor and an additional second transistor, wherein said second transistor, said additional first transistor and said additional second transistor, in combination, comprise NOR logic means for performing a NOR logic function.

18. A latch circuit as in claim 11, further comprising an additional first transistor and an additional second transistor, wherein said second transistor, said additional first transistor and said additional second transistor, in combination, comprise NAND logic means for performing a NAND logic function.

19. A latch circuit as in claim 11, further comprising two additional first transistors and two additional second transistors, wherein said second transistor, said two additional first transistors and said two additional second transistors, in combination, comprise NAND/NOR logic means for performing a NAND/NOR logic function.

20. An integrated circuit as in claim 11, wherein said first transistor comprises a P-channel transistor and said second transistor comprises an N-channel transistor.

* * * * *